United States Patent
Hou et al.

(10) Patent No.: US 12,317,423 B2
(45) Date of Patent: May 27, 2025

(54) METHOD OF MANUFACTURING A DEVICE SUBSTRATE

(71) Applicant: AUO Corporation, Hsinchu (TW)

(72) Inventors: Chun-Yueh Hou, Hsinchu (TW); Hao-An Chuang, Hsinchu (TW)

(73) Assignee: AUO Corporation, Hsinchu (TW)

(*) Notice: Subject to any disclaimer, the term of this patent is extended or adjusted under 35 U.S.C. 154(b) by 198 days.

(21) Appl. No.: 18/089,609

(22) Filed: Dec. 28, 2022

(65) Prior Publication Data
US 2024/0188221 A1    Jun. 6, 2024

(30) Foreign Application Priority Data
Dec. 1, 2022    (TW) .................................. 111146180

(51) Int. Cl.
*H05K 3/10*    (2006.01)
*H05K 1/02*    (2006.01)
*H05K 3/06*    (2006.01)

(52) U.S. Cl.
CPC ............. *H05K 3/10* (2013.01); *H05K 1/0298* (2013.01); *H05K 3/061* (2013.01); *H05K 2201/09154* (2013.01)

(58) Field of Classification Search
CPC ........ H05K 3/10; H05K 1/0298; H05K 3/061; H05K 2201/09154; H05K 3/146; H05K 3/403; G02F 1/13452; H01L 27/1259; H01L 23/5386; H01L 25/167; Y10T 29/49156; H01J 37/3435
See application file for complete search history.

(56) References Cited

U.S. PATENT DOCUMENTS

| | | | | |
|---|---|---|---|---|
| 6,025,901 | A | * | 2/2000 | Adachi ............... G02F 1/13452 |
| | | | | 349/158 |
| 6,262,513 | B1 | * | 7/2001 | Furukawa ............ H03H 9/6436 |
| | | | | 257/E23.128 |
| 10,964,868 | B2 | | 3/2021 | Song |
| 11,275,403 | B2 | | 3/2022 | Huang et al. |
| 11,282,994 | B2 | | 3/2022 | Feng et al. |

(Continued)

FOREIGN PATENT DOCUMENTS

| | | |
|---|---|---|
| CN | 111727404 | 9/2020 |
| CN | 111667776 | 8/2022 |

(Continued)

*Primary Examiner* — Donghai D Nguyen
(74) *Attorney, Agent, or Firm* — JCIPRNET

(57) ABSTRACT

A device substrate includes a circuit substrate and a side wiring structure. The circuit substrate includes a substrate and a front circuit structure on a front side of the substrate. The side wiring structure is electrically connected to the front circuit structure and extends from the front circuit structure to a back side of the circuit substrate. A cross-sectional structure of the side wiring structure includes a first portion, a second portion, and a third portion respectively located above a front side, a side surface, and the back side of the circuit substrate. The first, second, and third portions each include streaks. A ratio of a maximum thickness of the first portion to a maximum thickness of the second portion is A. A ratio of a maximum thickness of the third portion to the maximum thickness of the second portion is B. Each of A and B is 0.25-0.6.

6 Claims, 12 Drawing Sheets

(56) References Cited

U.S. PATENT DOCUMENTS

| | | | |
|---|---|---|---|
| 11,626,272 B2* | 4/2023 | Hou | H01J 37/3435 |
| | | | 204/298.12 |
| 2020/0013803 A1* | 1/2020 | Jang | H01L 25/167 |
| 2020/0243738 A1 | 7/2020 | Feng et al. | |
| 2020/0285271 A1 | 9/2020 | Huang et al. | |
| 2022/0173296 A1 | 6/2022 | Feng et al. | |
| 2022/0209087 A1 | 6/2022 | Feng et al. | |

FOREIGN PATENT DOCUMENTS

| | | |
|---|---|---|
| KR | 102328078 | 11/2021 |
| TW | 202023085 | 6/2020 |
| TW | I738533 | 9/2021 |
| TW | I750034 | 12/2021 |

\* cited by examiner

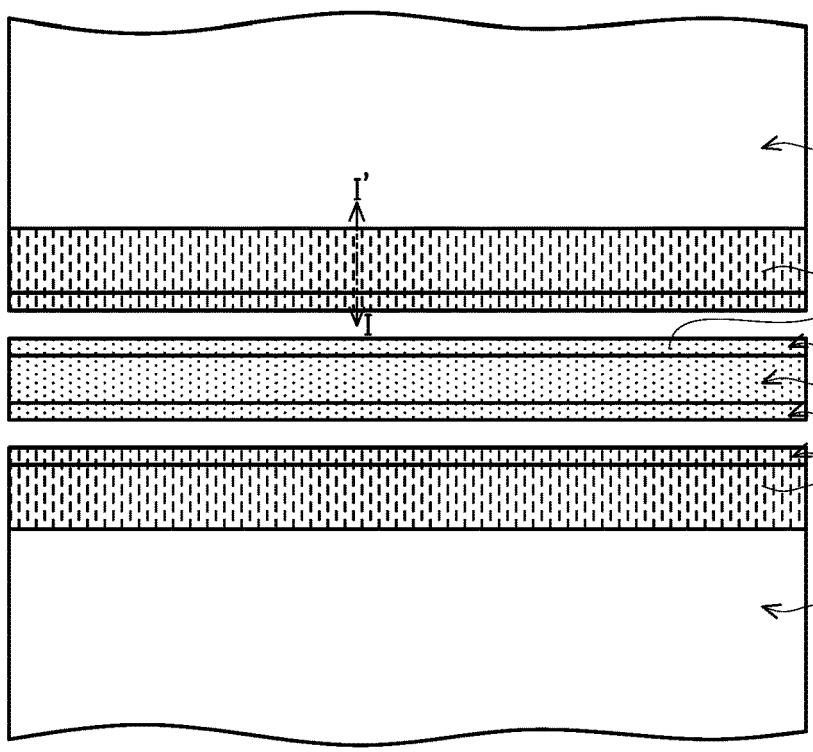
FIG. 2A
FIG. 2B
FIG. 2C
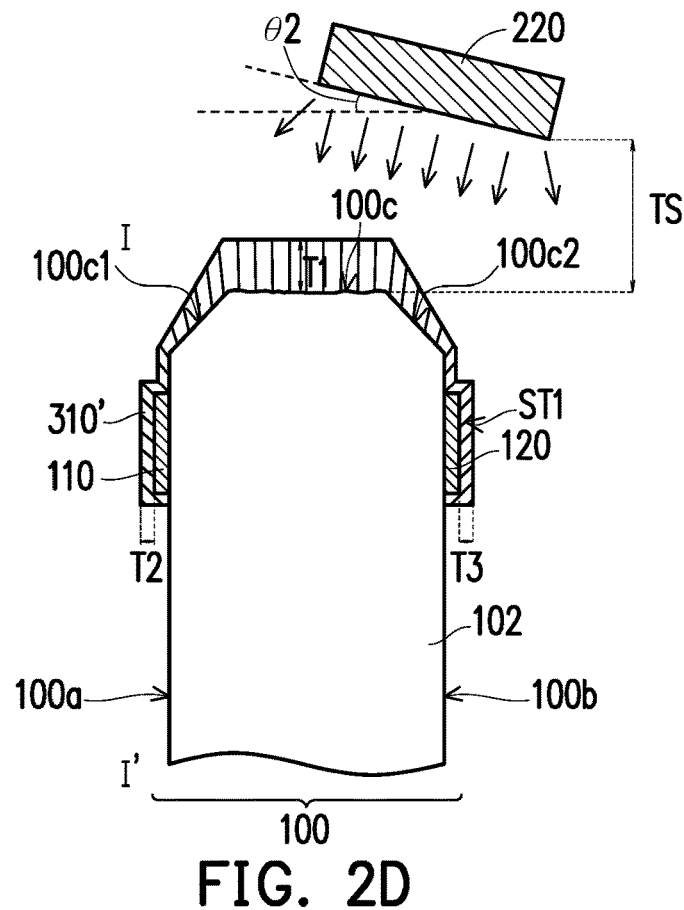
FIG. 2D

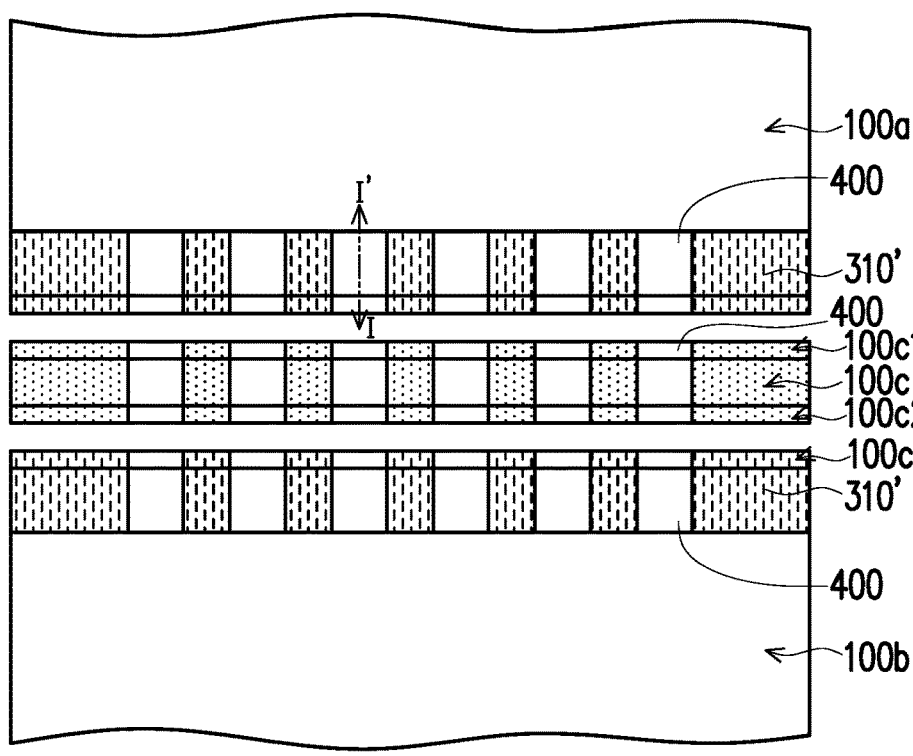
FIG. 3A
FIG. 3B
FIG. 3C
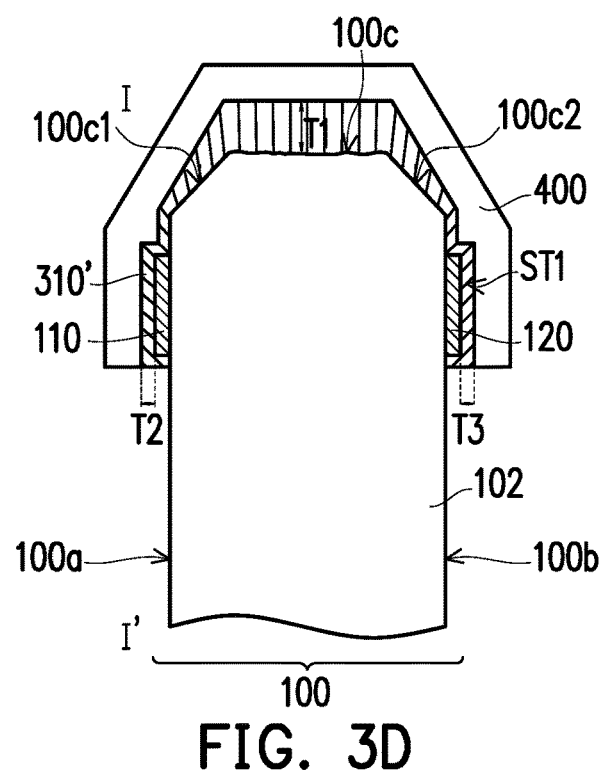
FIG. 3D

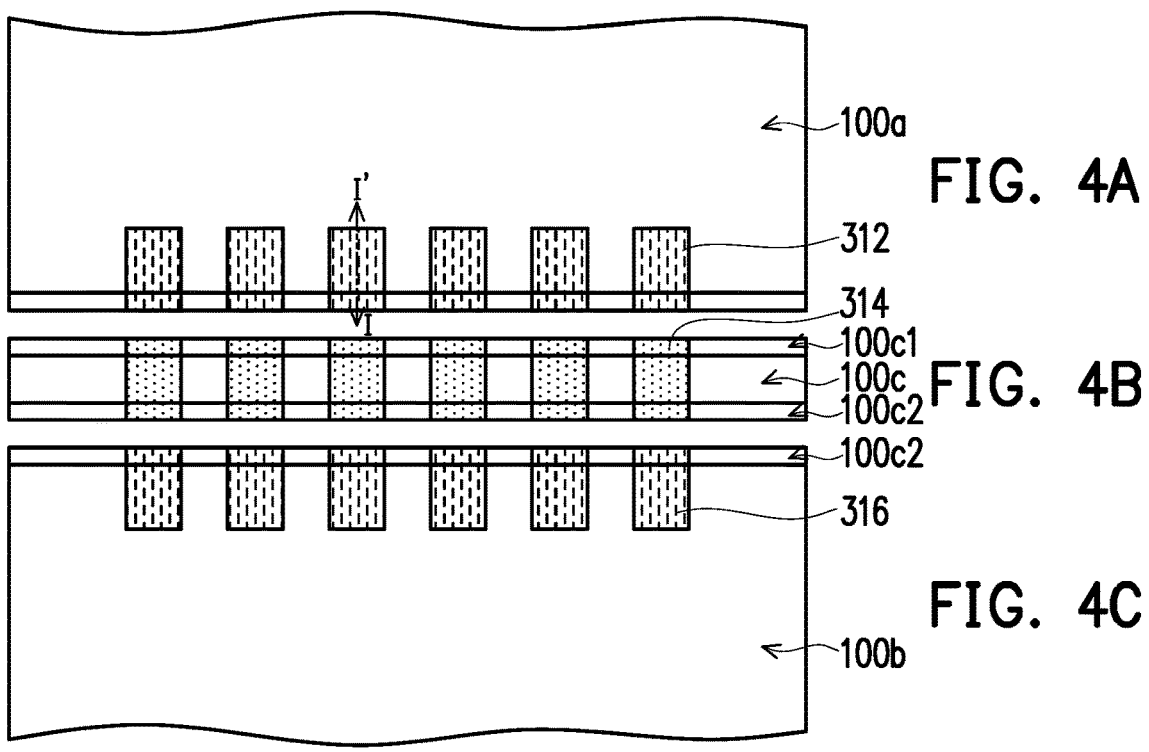
FIG. 4A
FIG. 4B
FIG. 4C
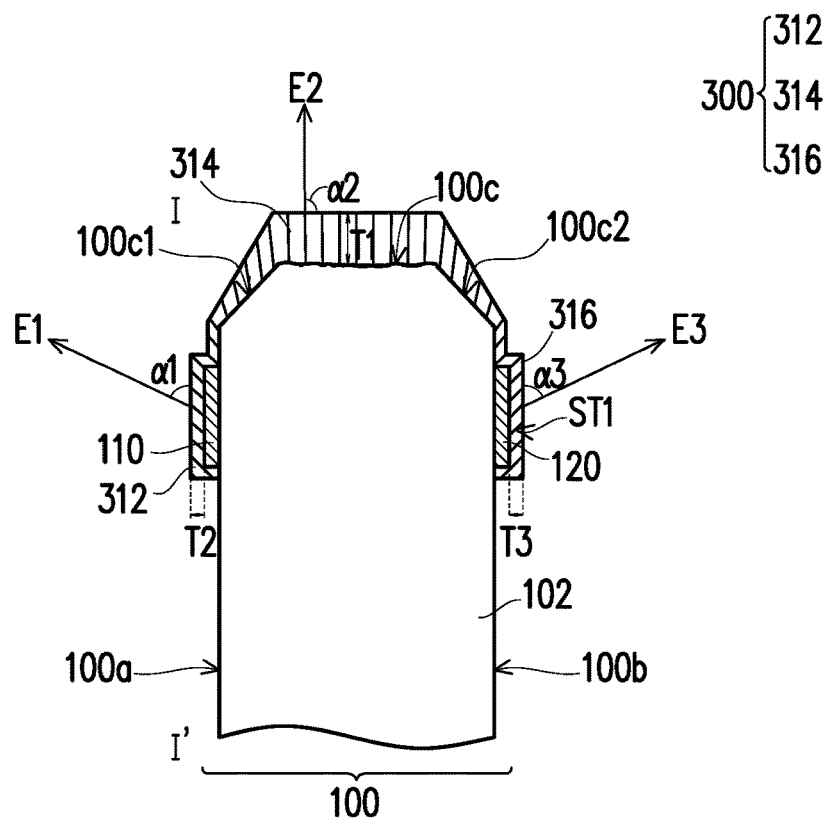
FIG. 4D

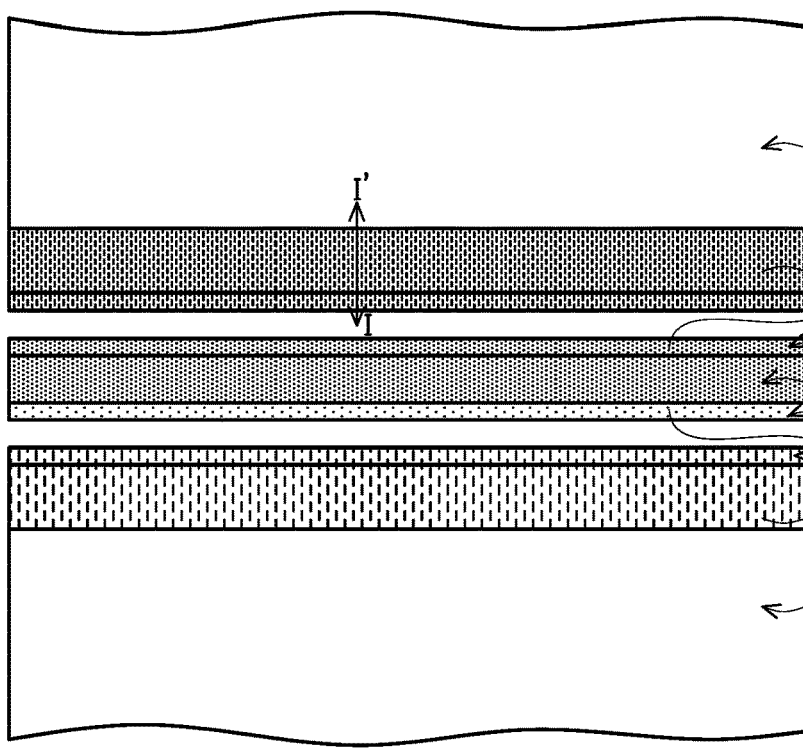
FIG. 5A
FIG. 5B
FIG. 5C
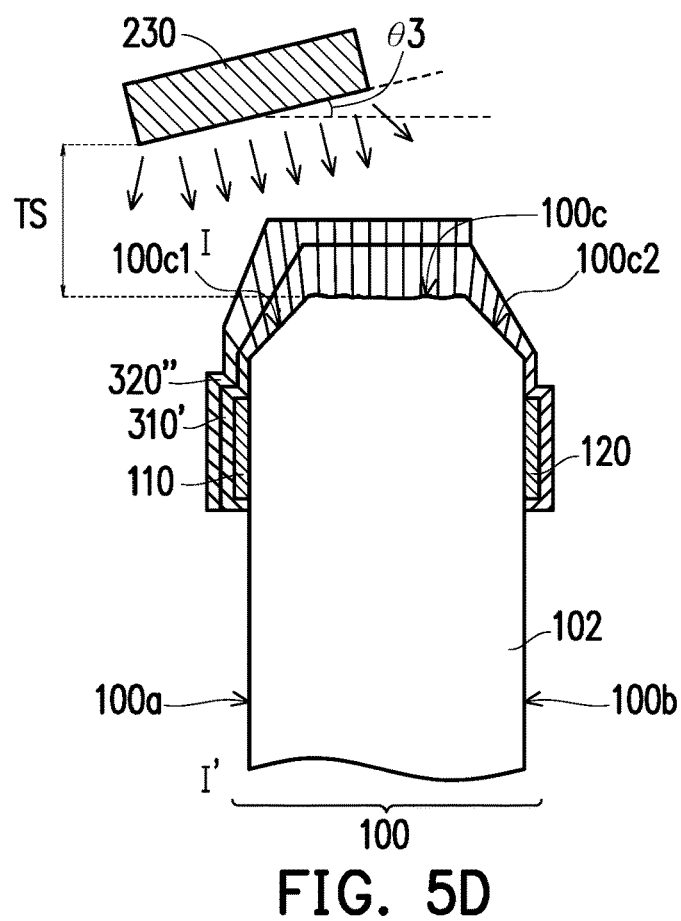
FIG. 5D

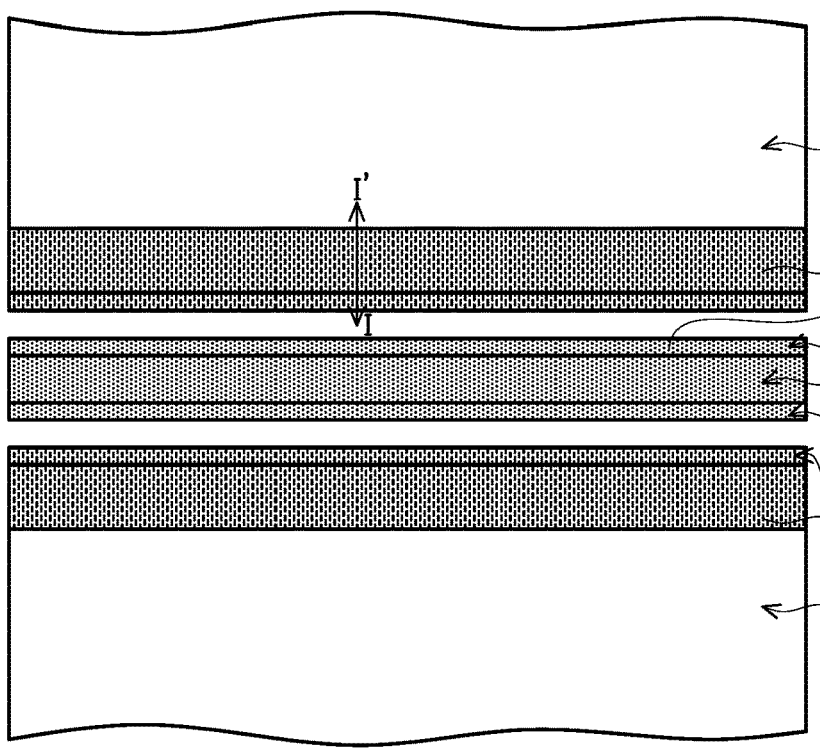
FIG. 6A
FIG. 6B
FIG. 6C
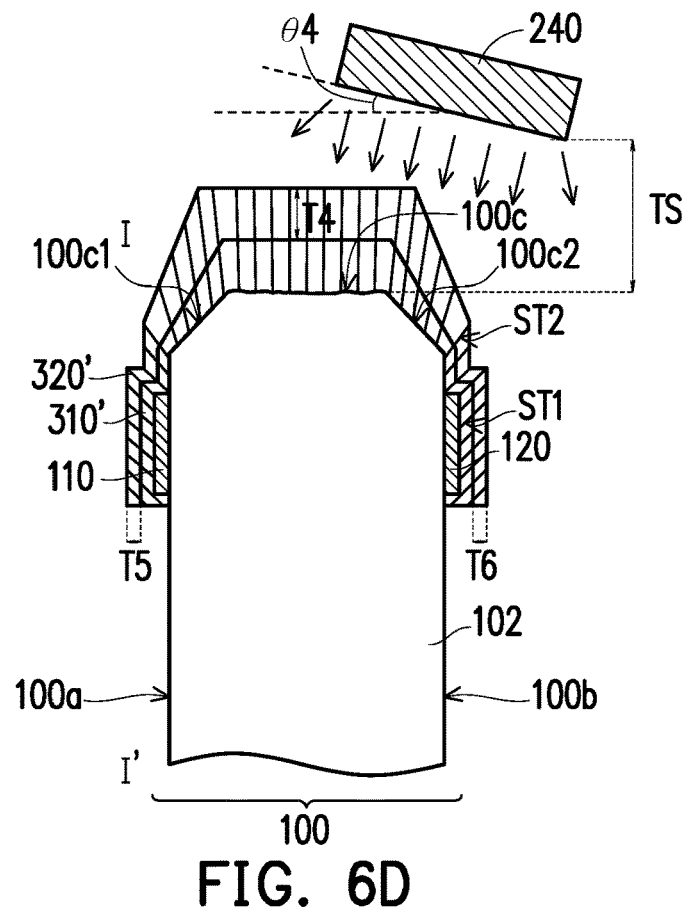
FIG. 6D

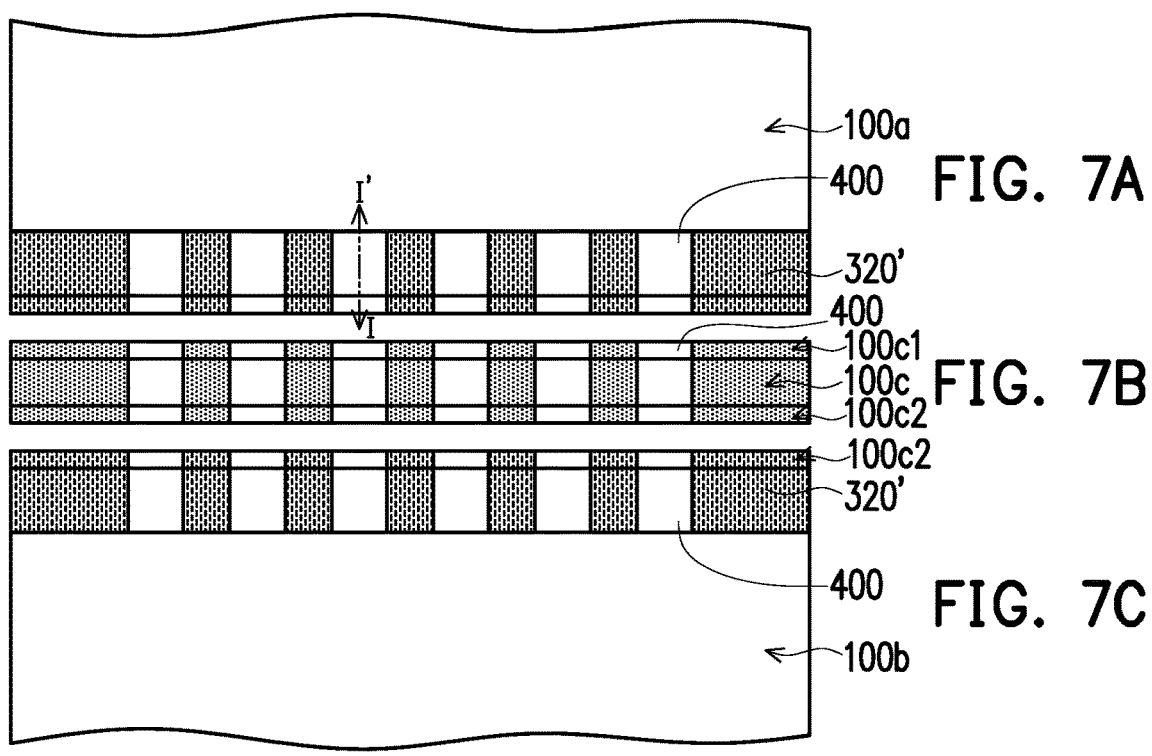
FIG. 7A
FIG. 7B
FIG. 7C
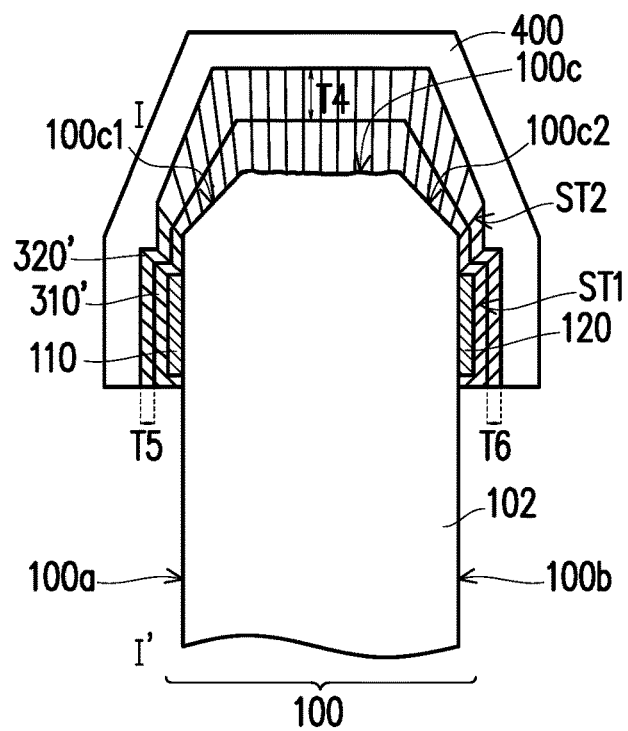
FIG. 7D

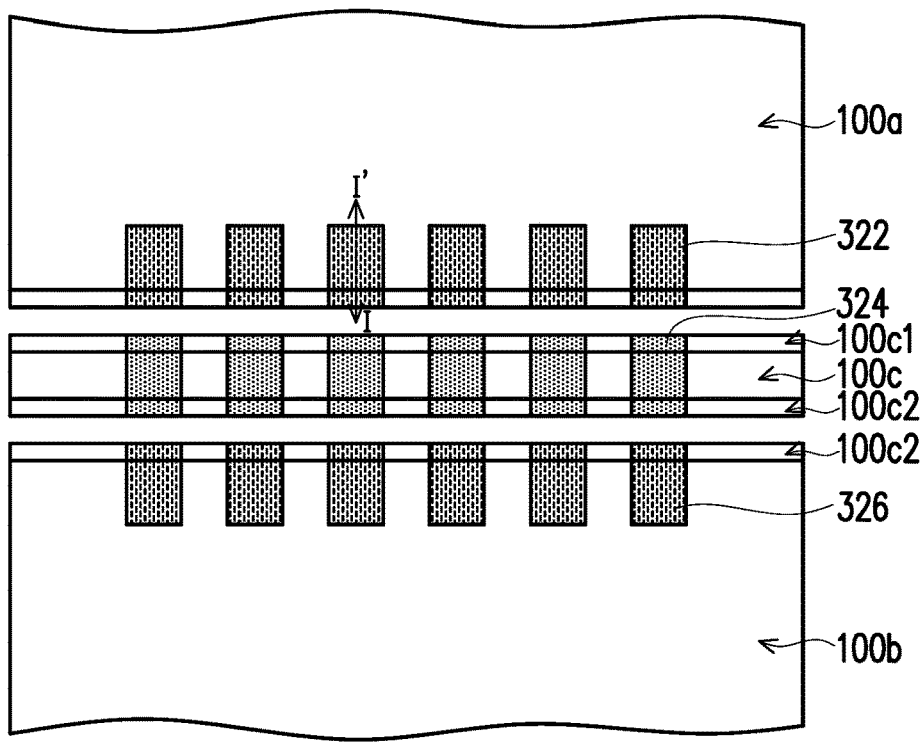
FIG. 8A
FIG. 8B
FIG. 8C
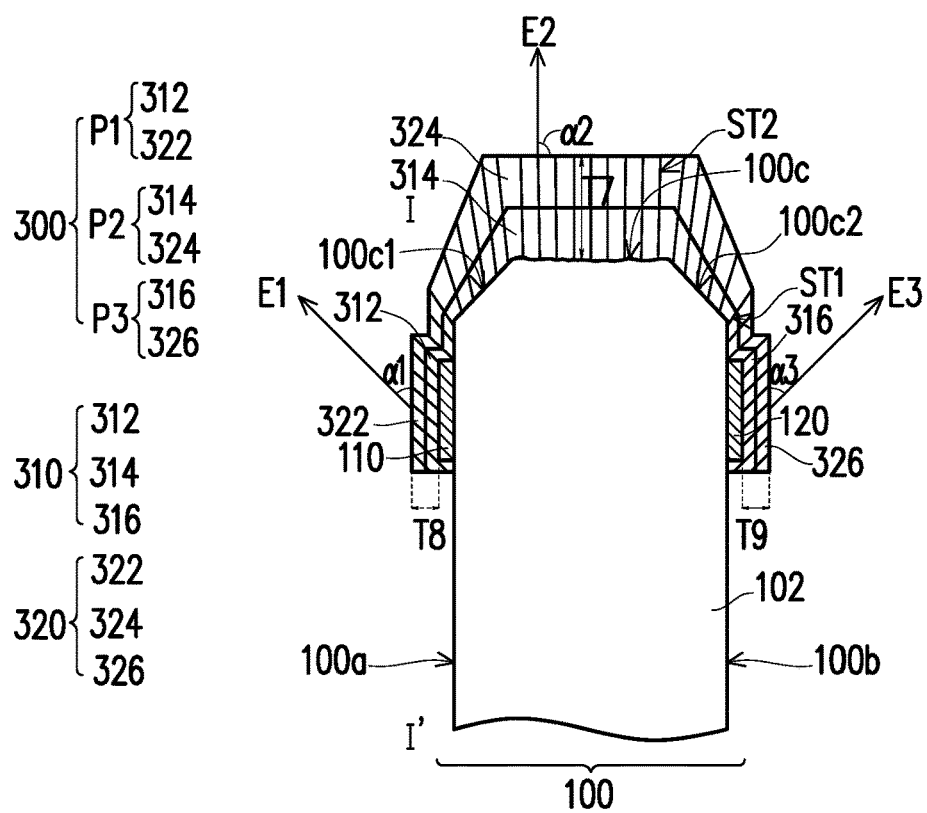
FIG. 8D

METHOD OF MANUFACTURING A DEVICE SUBSTRATE

CROSS-REFERENCE TO RELATED APPLICATION

This application claims the priority benefit of Taiwan application serial no. 111146180, filed on Dec. 1, 2022. The entirety of the above-mentioned patent application is hereby incorporated by reference herein and made a part of this specification.

BACKGROUND

Technical Field

The disclosure relates to a device substrate and a manufacturing method thereof.

Description of Related Art

To meet market demands, more and more manufacturers are dedicated to developing display panels with narrow side frames or even no side frames. Generally, in order to reduce the area of the side frames of the display panel, a chip or a chip-on-film (COF) package is disposed on a back side or a side surface of the display panel. For instance, pads located on a front side of the display panel are connected through a flexible circuit board, and the flexible circuit board is bent to the back side of the display panel. However, since the thickness of the flexible circuit board is relatively large, it is difficult for the flexible circuit board to be fully attached to the side surface of the display panel, and thus the area of the side frames of the display panel can barely be further reduced.

SUMMARY

The disclosure relates to a device substrate and a manufacturing method thereof, so as to reduce dimensions of side frames of the device substrate by a side wiring structure and improve production yield of the side wiring structure by performing a glancing angle deposition process.

At least one embodiment of the disclosure provides a manufacturing method of a device substrate, and the manufacturing method includes following steps. A circuit substrate is provided, and the circuit substrate includes a carrier and a front circuit structure located on a front side of the carrier. A side wiring structure electrically connected to the front circuit structure is formed, where the side wiring structure extends from the front circuit structure to a back side of the circuit substrate, and a method of forming the side wiring structure includes following steps. A first glancing angle deposition process is performed above a front side and a side surface of the circuit substrate by applying a first target, where a first included angle exists between a front side of the first target and the side surface of the circuit substrate. A second glancing angle deposition process is performed above the back side and the side surface of the circuit substrate by applying a second target, where a second included angle exists between a front side of the second target and the side surface of the circuit substrate. A cross-sectional structure of the side wiring structure includes a first portion located above the front side of the circuit substrate, a second portion located above the side surface of the circuit substrate, and a third portion located above the back side of the circuit substrate, where each of the first portion, the second portion, and the third portion includes a plurality of streaks. A ratio of a maximum thickness of the first portion to a maximum thickness of the second portion is A, a ratio of a maximum thickness of the third portion to the maximum thickness of the second portion is B, and A and B are 0.25-0.6, respectively.

At least one embodiment of the disclosure provides a device substrate that includes a circuit substrate and a side wiring structure. The circuit substrate includes a carrier and a front circuit structure located on a front side of the carrier. The side wiring structure is electrically connected to the front circuit structure and extends from the front circuit structure to a back side of the circuit substrate. A cross-sectional structure of the side wiring structure includes a first portion located above a front side of the circuit substrate, a second portion located above a side surface of the circuit substrate, and a third portion located above the back side of the circuit substrate, where each of the first portion, the second portion, and the third portion includes a plurality of streaks. A ratio of a maximum thickness of the first portion to a maximum thickness of the second portion is A, a ratio of a maximum thickness of the third portion to the maximum thickness of the second portion is B, and A and B are 0.25-0.6, respectively.

In view of the above, according to one or more embodiments of the disclosure, the side wiring structure is formed by applying the glancing angle deposition process, so as to reduce the dimensions of the side frames of the device substrate. Besides, by adjusting the thickness of the first portion, the thickness of the second portion, and the thickness of the third portion of the side wiring structure, the production yield of the side wiring structure may be improved.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A, FIG. 2A, FIG. 3A, and FIG. 4A are schematic top views of a manufacturing method of a device substrate according to an embodiment of the disclosure.

FIG. 1B, FIG. 2B, FIG. 3B, and FIG. 4B are schematic side views of a manufacturing method of a device substrate according to an embodiment of the disclosure.

FIG. 1C, FIG. 2C, FIG. 3C, and FIG. 4C are schematic bottom views of a manufacturing method of a device substrate according to an embodiment of the disclosure.

FIG. 1D, FIG. 2D, FIG. 3D, and FIG. 4D are schematic cross-sectional views taken alone a line I-I' depicted in FIG. 1A, FIG. 2A, FIG. 3A, and FIG. 4A.

FIG. 5A, FIG. 6A, FIG. 7A, and FIG. 8A are schematic top views of a manufacturing method of a device substrate according to an embodiment of the disclosure.

FIG. 5B, FIG. 6B, FIG. 7B, and FIG. 8B are schematic side views of a manufacturing method of a device substrate according to an embodiment of the disclosure.

FIG. 5C, FIG. 6C, FIG. 7C, and FIG. 8C are schematic bottom views of a manufacturing method of a device substrate according to an embodiment of the disclosure.

FIG. 5D, FIG. 6D, FIG. 7D, and FIG. 8D are schematic cross-sectional views taken alone a line I-I' depicted in FIG. 5A, FIG. 6A, FIG. 7A, and FIG. 8A.

DESCRIPTION OF THE EMBODIMENTS

Figure 1A:
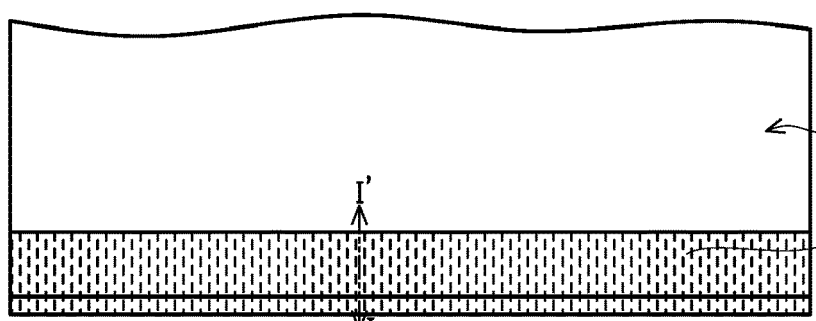
Figure 1B:
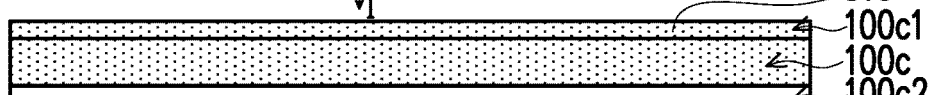
Figure 1C:
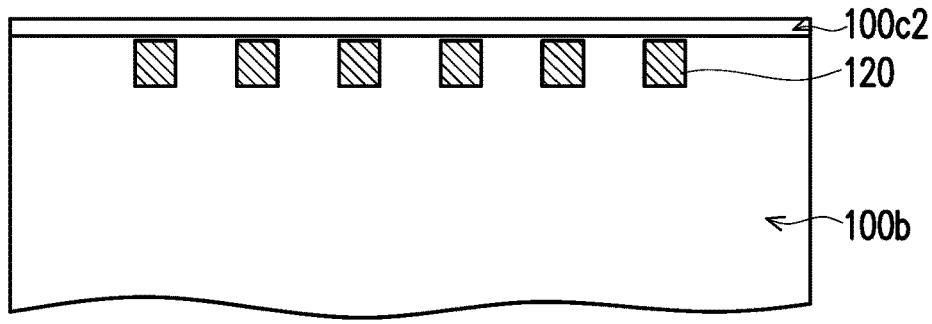

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A, FIG. 2A, FIG. 3A, and FIG. 4A are schematic top views of a manufacturing method of a device substrate according to an embodiment of the disclosure. FIG. 1B, FIG. 2B, FIG. 3B, and FIG. 4B are schematic side views of a manufacturing method of a device substrate according to an embodiment of the disclosure. FIG. 1C, FIG. 2C, FIG. 3C, and FIG. 4C are schematic bottom views of a manufacturing method of a device substrate according to an embodiment of the disclosure. FIG. 1D, FIG. 2D, FIG. 3D, and FIG. 4D are schematic cross-sectional views taken alone a line I-I' depicted in FIG. 1A, FIG. 2A, FIG. 3A, and FIG. 4A. To facilitate explanation, FIG. 1D and FIG. 2D not only illustrate the cross-sectional structure taken alone the line I-I' depicted in FIG. 1A and FIG. 2A but also illustrate a cross-sectional structure of a first target 210 and a second target 220.

With reference to FIG. 1A to FIG. 1D, a circuit substrate 100 is provided. The circuit substrate 100 includes a carrier 102 and a front circuit structure 110 located on a front side 100a of the carrier 102. In this embodiment, the circuit substrate 100 may optionally further includes a back circuit structure 120. The back circuit structure 120 is located on a back side 100b of the carrier 102.

The circuit substrate 100 includes the front side 100a, the back side 100b opposite to the front side 100a, and a side surface 100c. In this embodiment, the front side 100a and the side surface 100c may optionally include a first inclined surface 100c1 therebetween, and the back side 100b and the side surface 100c may optionally include a second inclined surface 100c2 therebetween, which should however not be construed as a limitation in the disclosure. In other embodiments, there is a right angle or a round angle between the front side 100a and the side surface 100c, and there is a right angle or a round angle between the back side 100b and the side surface 100c.

The carrier 102 is, for instance, a rigid carrier, and a material of the carrier 102 includes glass, quartz, organic polymer, or an opaque/reflective material (e.g., wafer, ceramics, or other applicable materials), or other applicable materials, which should however not be construed as a limitation in the disclosure. In other embodiments, the carrier 102 may be a flexible carrier or a stretchable carrier.

The front circuit structure 110 is formed on the front side of the carrier 102. In this embodiment, a pad in the front circuit structure 110 is shown in the drawings, while structures other than the pad in the front circuit structure 110 are omitted. As a matter of fact, the front circuit structure 110 may include a plurality of conductive layers (not shown) and a plurality of insulation layers (not shown), and the pad of the front circuit structure 110 may have a single-layer structure or a multi-layer structure. In some embodiments, the front circuit structure 110 may be connected to a plurality of active devices (not shown) and/or a plurality of passive devices (not shown), and the active devices (not shown) may be thin film transistors.

The back circuit structure 120 is formed on the back side of the carrier 102. In this embodiment, the pad in the back circuit structure 120 is shown, while structures other than the pad in the back circuit structure 120 are omitted. As a matter of fact, the back circuit structure 120 may include a plurality of conductive layers (not shown), and the pad of the back circuit structure 120 may have a single-layer structure or a multi-layer structure. In other embodiments, the back circuit structure 120 may be omitted.

In some embodiments, a roughness of the side surface 100c of the carrier 102 is greater than a roughness of the first inclined surface 100c1 and a roughness of the second inclined surface 100c2 of the carrier 102. Specifically, since a thickness T1 of a first conductive material layer 310' (as shown in FIG. 2D) is greater than a thickness T2, a stress formed on the side surface 100c of the carrier 102 is relatively large and easily causes film layers to be peeled off; therefore, the side surface 100c of the carrier 102 should be designed to have a relatively large roughness to improve adhesion between the film layers, and the roughness of the first inclined surface 100c1, the roughness of the second inclined surface 100c2, a roughness of the front side 100a, and a roughness of the back side 100b are relatively small. in some embodiments, the roughness of the side surface 100c of the carrier 102 is 0.5 micrometer (μm) to 2 μm, and the roughness of the front side 100a of the carrier 102, the roughness of the first inclined surface 100c1 of the carrier 102, and the roughness of the second inclined surface 100c2 of the carrier 102 are 0.1 μm to 0.5 μm.

Figure 1D:
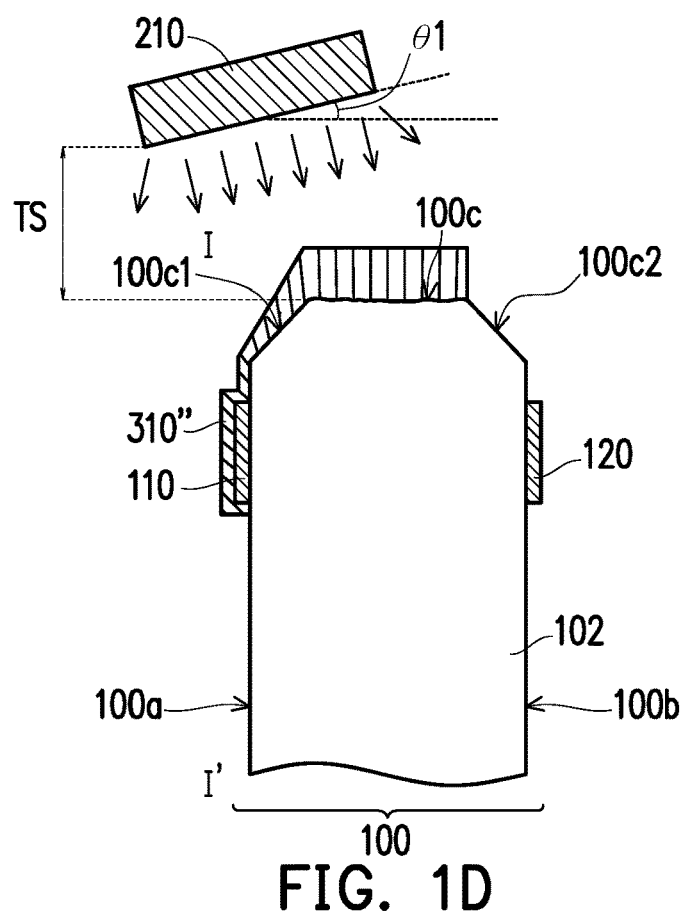

A first glancing angle deposition process is performed on the front side 100a and the side surface 100c of the circuit substrate 100 by applying the first target 210, so as to deposit a conductive material 310" onto the front side 100a and the side surface 100c of the circuit substrate 100. In this embodiment, the conductive material 310" is also deposited onto the first inclined surface 100c1. In FIG. 1D, the conductive material 310" is not formed on the second inclined surface 100c2, which should however not be construed as a limitation in the disclosure. In some embodiments, parts of the conductive material 310" may be deposited onto the second inclined surface 100c2, and even a small amount of the conductive material 310" may be deposited onto the back side 100b.

With reference to FIG. 2A to FIG. 2D, a second glancing angle deposition process is performed above the back side 100b and the side surface 100c of the circuit substrate 100 by applying the second target 220. The first conductive material layer 310' is formed by performing the first glancing angle deposition process and the second glancing angle deposition process. The first conductive material layer 310' extends from the top of the front side 100a of the circuit substrate 100 to the top of the back side 100b of the circuit substrate 100 through the first inclined surface 100c1, the side surface 100c, and the second inclined surface 100c2. The first conductive material layer 310' is connected to the front circuit structure 110 and the back circuit structure 120.

With reference to FIG. 1D and FIG. 2D at the same time, in this embodiment, a first included angle θ1 exists between a front side of the first target 210 and the side surface 100c of the circuit substrate 100, and a second included angle θ2 exists between a front side of the second target 220 and the side surface 100c of the circuit substrate 100. The first included angle θ1 and the second included angle θ2 are greater than 0°. In an embodiment of the disclosure, the first included angle θ1 and the second included angle θ2 are 10° to 40°. When the first included angle θ1 and the second included angle θ2 are 10° to 40°, the resultant first conductive material layer 310' has proper uniformity, and the adhesion between the first conductive material layer 310' and the circuit substrate 100 is favorable. In some embodiments, a distance TS between the first target 210 and the circuit substrate 100 and a distance TS between the second target 220 and the circuit substrate 100 are 8 centimeters (cm) to 14 cm.

In some embodiments, the first target 210 and the second target 220 include the same material, and a material of the first conductive material layer 310' formed by performing the first glancing angle deposition process and the second glancing angle deposition process includes tungsten, copper, titanium, molybdenum, silver, aluminum, thallium, nickel, chromium, or alloys of the aforementioned metals.

In this embodiment, a maximum thickness T1 of the first conductive material layer 310' on the side surface 100c of the circuit substrate 100 is greater than a maximum thickness T2 of the first conductive material layer 310' on the front side 100a of the circuit substrate 100 and a maximum thickness T3 of the first conductive material layer 310' on the back side 100b of the circuit substrate 100. Since the thickness of the first conductive material layer 310' on the side surface 100c of the circuit substrate 100 is relatively large, the first conductive material layer 310' may be better protected from being broken or peeled off due to the relatively rough side surface 100c of the circuit substrate 100.

In addition, in this embodiment, since the first conductive material layer 310' is formed by performing the glancing angle deposition processes, the cross-sectional structure of the first conductive material layer 310' includes a plurality of streak ST1. In some embodiments, a cross-sectional structure of the first conductive material layer 310' includes streaks ST1 that extend in different directions. For instance, the cross-sectional structure of the first conductive material layer 310' includes the streaks ST1 extending in three or more directions.

With reference to FIG. 3A to FIG. 3D, a mask layer 400 is formed on the first conductive material layer 310'. In some embodiments, a method of forming the mask layer 400 includes a photolithography process, a screen printing process, or an inkjet printing process, and a material of the mask layer 400 includes cured photoresist. The mask layer 400 covers at least parts of the first conductive material layer 310', and the mask layer 400 extends from the top of the front side 100a of the circuit substrate 100 to the top of the back side 100b of the circuit substrate 100 through the first inclined surface 100c1, the side surface 100c, and the second inclined surface 100c2.

With reference to FIG. 4A to FIG. 4D, an etching process is performed by applying the mask layer 400 as a mask to pattern the first conductive material layer 310' and obtain a side wiring structure 300. The etching process is a wet etching process, where an etching solution may be correspondingly selected in response to the metal of the first conductive material layer 310'.

The side wiring structure 300 extends from the front circuit structure 110 to the back circuit structure 120. A cross-sectional structure of the side wiring structure 300 includes a first portion 312 located above the front side 100a of the circuit substrate 100, a second portion 314 located above the side surface 100c of the circuit substrate 100, and a third portion 316 located above the back side 100b of the circuit substrate 100. In this embodiment, the second portion 314 is further located above the first inclined surface 100c1 and the second inclined surface 100c2, and the second portion 314 is connected to the first portion 312 and the third portion 316.

In this embodiment, a ratio of the maximum thickness T2 of the first portion 312 to the maximum thickness T1 of the second portion 314 is A, a ratio of the maximum thickness T3 of the third portion 316 to the maximum thickness T1 of the second portion 314 is B. and each of A and B is 0.25 to 0.6, respectively. Since the second portion 314 is relatively thick, the side wiring structure 300 may be better protected from being broken or peeled off due to the relatively rough side surface 100c of the circuit substrate 100. In this embodiment. A and B are less than 0.6, so that the side wiring structure 300 on the side surface 100c may be better protected from being broken or peeled off; A and B are greater than 0.25, so as to prevent the difficulty in controlling the etching process due to the excessively large differences between the thicknesses of the first conductive material layer 310' at different locations.

In this embodiment, since the method of forming the side wiring structure 300 includes the glancing angle deposition processes, each of the first portion 312, the second portion 314, and the third portion 316 includes a plurality of streaks ST1. The streaks ST1 of the first portion 312, the second portion 314, and the third portion 316 of the side wiring structure 300 extend in at least three different directions. For instance, an included angle α1 between an extension direction E1 of the streaks ST1 of the first portion 312 and the front side 100a of the circuit substrate 100 is 10° to 80°. An included angle α3 between an extension direction E3 of the streaks ST1 of the third portion 316 and the back side 100b of the circuit substrate 100 is 10° to 80°. An included angle α2 between an extension direction E2 of the streaks ST1 of the second portion 314 and the side surface 100c of the circuit substrate 100 is about 80° to 90°. In some embodiments, the streaks ST1 have gradient extension directions. For instance, the extension direction of the streaks ST1 tilted to the side surface 100c is gradually changed to be perpendicular to the side surface 100c as it approaches to the second portion 314.

FIG. 5A, FIG. 6A, FIG. 7A, and FIG. 8A are schematic top views of a manufacturing method of a device substrate according to an embodiment of the disclosure. FIG. 5B, FIG. 6B, FIG. 7B, and FIG. 8B are schematic side views of a manufacturing method of a device substrate according to an embodiment of the disclosure. FIG. 5C, FIG. 6C, FIG. 7C, and FIG. 8C are schematic bottom views of a manufacturing method of a device substrate according to an embodiment of the disclosure. FIG. 5D, FIG. 6D. FIG. 7D, and FIG. 8D are schematic cross-sectional views taken alone a line I-I' depicted in FIG. 5A, FIG. 6A, FIG. 7A, and FIG. 8A. To facilitate explanation. FIG. 5D and FIG. 6D not only illustrate the cross-sectional structure taken alone the line I-I' depicted in FIG. 5A and FIG. 6A but also illustrate a cross-sectional structure of a third target 230 and a fourth target 240.

With reference to FIG. 5A to FIG. 5D, following the steps shown in FIG. 1A to FIG. 2D, a third glancing angle deposition process is performed above the front side 100*a* and the side surface 100*c* of the circuit substrate 100 by applying the third target 230, so as to deposit a conductive material 320″ onto the front side 100*a* and the side surface 100*c* of the circuit substrate 100. In this embodiment, the conductive material 320″ is further deposited onto the first inclined surface 100*c*1. In FIG. 5D, the conductive material 320″ is not formed on the second inclined surface 100*c*2, which should however not be construed as a limitation in the disclosure. In some embodiments, parts of the conductive material 320″ may be deposited onto the second inclined surface 100*c*2, and even a small amount of the conductive material 320″ may be deposited onto the back side 100*b*.

With reference to FIG. 6A to FIG. 6D, a fourth glancing angle deposition process is performed above the back side 100*b* and the side surface 100*c* of the circuit substrate 100 by applying the fourth target 240. A second conductive material layer 320' is formed by performing the third glancing angle deposition process and the fourth glancing angle deposition process. The second conductive material layer 320' extends from the top of the front side 100*a* of the circuit substrate 100 to the top of the back side 100*b* of the circuit substrate 100 through the first inclined surface 100*c*1, the side surface 100*c*, and the second inclined surface 100*c*2. The second conductive material layer 320' fully or partially covers the first conductive material layer 310'.

With reference to FIG. 5D and FIG. 6D at the same time, in this embodiment, a third included angle θ3 exists between a front side of the third target 230 and the side surface 100*c* of the circuit substrate 100, and a fourth included angle θ2 exists between a front side of the fourth target 240 and the side surface 100*c* of the circuit substrate 100. The third included angle θ3 and the fourth included angle θ4 are greater than 0°. In an embodiment of the disclosure, the third included angle θ3 and the fourth included angle θ4 are 10° to 40°. When the third included angle θ3 and the fourth included angle θ4 are 10° to 40°, the resultant second conductive material layer 320' has proper uniformity. In some embodiments, a distance between the third target 230 and the circuit substrate 100 and a distance TS between the fourth target 240 and the circuit substrate 100 are 8 cm to 14 cm.

In some embodiments, the third target 230 and the fourth target 240 include the same material, and a material of the second conductive material layer 320' formed by performing the third glancing angle deposition process and the fourth glancing angle deposition process includes tungsten, copper, titanium, molybdenum, silver, aluminum, thallium, nickel, chromium, or alloys of the aforementioned metals. In some embodiments, the second conductive material layer 320' and the first conductive material layer 310' include different materials. For instance, the material selected by the first conductive material layer 310' may lead to a relatively large adhesion between the first conductive material layer 310' and the carrier 102, and the material selected by the second conductive material layer 320' has a relatively high conductivity.

In this embodiment, a maximum thickness T4 of the second conductive material layer 320' on the side surface 100*c* of the circuit substrate 100 is greater than a maximum thickness T5 of the second conductive material layer 320' on the front side 100*a* of the circuit substrate 100 and a maximum thickness T6 of the second conductive material layer 310' on the back side 100*b* of the circuit substrate 100.

In addition, in this embodiment, since the second conductive material layer 320' is formed by performing the glancing angle deposition processes, a cross-sectional structure of the second conductive material layer 320' includes a plurality of streaks ST2. In some embodiments, the cross-sectional structure of the second conductive material layer 320' includes the streaks ST2 that extend in different directions. For instance, the cross-sectional structure of the second conductive material layer 320' includes the streaks ST2 that extend in three or more directions. In some embodiments, the streaks ST1 in the first conductive material layer 310' and the streaks ST2 in the second conductive material layer 320' may or may not be connected. For instance, parts of the streaks ST1 are connected to the streaks ST2, and the other parts of the streaks ST1 are not connected to the streaks ST2. In FIG. 6D, the streaks ST1 and the streaks ST2 are exemplarily connected.

With reference to FIG. 7A to FIG. 7D, a mask layer 400 is formed on the second conductive material layer 320'. In some embodiments, a material of the mask layer 400 includes cured photoresist, and a method of forming the mask layer 400 includes a photolithography process, a screen printing process, or an inkjet printing process. The mask layer 400 covers at least parts of the second conductive material layer 320', and the mask layer 400 extends from the top of the front side 100*a* of the circuit substrate 100 to the top of the back side 100*b* of the circuit substrate 100 through the first inclined surface 100*c*1, the side surface 100*c*, and the second inclined surface 100*c*2.

With reference to FIG. 8A to FIG. 8D, an etching process is performed by applying the mask layer 400 as a mask to pattern the first conductive material layer 310' and the second conductive material layer 320' and obtain a side wiring structure 300 with a multi-layer structure. In this embodiment, the first conductive material layer 310' is patterned to form a buffer layer 310, the second conductive material layer 320' is patterned to form a conductive layer 320, and the side wiring structure 300 includes the buffer layer 310 and the conductive 320 stacked together. The etching process is a wet etching process, where an etching solution may be correspondingly selected in response to the metal of the first conductive material layer 310' and the second conductive material layer 320'.

In some embodiments, the buffer layer 310 and the conductive layer 320 include different materials. For instance, an adhesion between the material of the buffer layer 310 and the carrier 102 is greater than an adhesion between the material of the conductive layer 320 and the carrier 102. A conductivity of the material of the conductive layer 320 is greater than a conductivity of the material of the buffer layer 310.

The side wiring structure 300 extends from the front circuit structure 110 to the back circuit structure 120. A cross-sectional structure of the side wiring structure 300 includes a first portion P1 located above the front side 100*a* of the circuit substrate 100, a second portion P2 located above the side surface 100*c* of the circuit substrate 100, and a third portion P3 located above the back side 100*b* of the circuit substrate 100. In this embodiment, the second portion P2 is further located on the first inclined surface 100*c*1 and the second inclined surface 100*c*2, and the second portion P2 is connected to the first portion P1 and the third portion P3.

In this embodiment, the first portion P1 includes the first portion 312 of the buffer layer 310 and a first portion 322 of the conductive layer 320 stacked together, the second portion P2 includes the second portion 314 of buffer layer 310 and a second portion 324 of the conductive layer 320 stacked together, and the third portion P3 includes the third portion 316 of the buffer layer 310 and a third portion 326 of the conductive layer 320 stacked together.

In this embodiment, a ratio of a maximum thickness T8 of the first portion P1 to a maximum thickness T7 of the second portion P2 is A, a ratio of a maximum thickness T9 of the third portion P3 to the maximum thickness T7 of the second portion P2 is B, and each of A and B is 0.25 to 0.6, respectively. Since the second portion P2 is relatively thick, the side wiring structure 300 may be better protected from being broken or peeled off due to the relatively rough side surface 100c of the circuit substrate 100. In this embodiment, A and B are less than 0.6, so that the side wiring structure 300 on the side surface 100c may be better protected from being broken or peeled off; A and B are greater than 0.25, so as to prevent the difficulty in controlling the etching process due to the excessively large differences between the thicknesses of the first conductive material layer 310' and the second conductive material layer 320' at different locations.

The included angles (the first included angle θ1 to the fourth included angle θ4) between the front sides of the targets (the first target 210 to the fourth target 240) and the side surface 100c of the circuit substrate 100 in the first glancing angle deposition process to the fourth glancing angle deposition process are adjusted, the distances TS between the targets (the first target 210 to the fourth target 240) and the circuit substrate 100 are adjusted, an average thickness F of the resultant conductive material layers (the first conductive material layer 310' and the second conductive material layer 320' as shown in FIG. 6D) on the front surface 100a of the circuit structure 100, an average thickness S of the resultant conductive material layers on the side surface 100c of the circuit substrate 100, and an average thickness B of the resultant conductive material layers on the back side 100b of the circuit substrate 100 are measured, and the measured results are shown in Table 1.

TABLE 1

| | θ1-θ4 | | | | | | | | |
|---|---|---|---|---|---|---|---|---|---|
| | 10° | | 20° | | 24.4° | | 28.4° | | 30° |
| TS (cm) | 8 | 14 | 8 | 14 | 8 | 14 | 8 | 14 | 8 | 14 |
| S (Angstrom) | 7410 | 5923 | 6913 | 4938 | 6075 | 4298 | 6556 | 4412 | 6914 | 5106 |
| F (Angstrom) | 3042 | 1920 | 2827 | 1608 | 3135 | 1341 | 2915 | 1508 | 2301 | 1848 |
| F/S | 41% | 32% | 41% | 44% | 52% | 31% | 44% | 34% | 33% | 36% |
| B | 2915 | 1954 | 2904 | 1571 | 3084 | 1395 | 2786 | 1785 | 2274 | 1453 |
| B/S | 39% | 33% | 42% | 32% | 51% | 32% | 42% | 40% | 33% | 28% |

In this embodiment, the conductive layer 320 and the buffer layer 310 respectively include the corresponding streaks ST2 and ST1. In some embodiments, parts of the corresponding streaks ST2 in the conductive layer 320 are connected to the corresponding streaks ST1 in the buffer layer 310. In some embodiments, parts of the corresponding streaks ST2 in the conductive layer 320 are not connected to the corresponding streaks ST1 in the buffer layer 310. In FIG. 8D, the streaks ST1 and the streaks ST2 are exemplarily connected.

The first portion 312, the second portion 314, and the third portion 316 of the buffer layer 310 include the streaks ST1 at least extending in three different directions; the first portion 322, the second portion 324, and the third portion 326 of the conductive layer 320 include the streaks ST2 at least extending in three different directions. For instance, an included angle α1 between an extension direction E1 of the streaks ST1 of the first portion 312 and the extension direction E1 of the streaks T2 of the first portion 322 and the front side 100a of the circuit substrate 100 is 10° to 80°. An included angle α3 between an extension direction E3 of the streaks ST1 of the third portion 316 and the extension direction E3 of the streaks ST2 of the third portion 326 and the back side 100b of the circuit substrate 100 is 10° to 80°. The included angle α2 between an extension direction E2 of the streaks ST1 of the second portion 314 and the extension direction E2 of the streaks ST2 of the second portion 324 and the side surface 100c of the circuit substrate 100 is about 80° to 90°. In some embodiments, the streaks ST1 and the streaks ST2 have gradient extension directions. For instance, the extension directions of the streaks ST1/the streaks ST2 tilted to the side surface 100c are gradually changed to be perpendicular to the side surface 100c as they approach to the second portion 314/the second portion 324.

It can be learned from Table 1 that when the first included angle θ1 to the fourth included angle θ4 are 10° to 30°, the average thickness S of the second portion P2 of the resultant side wiring structure 300 is greater than the average thickness F of the first portion P1 and the average thickness B of the first portion P1.

Figure 9:
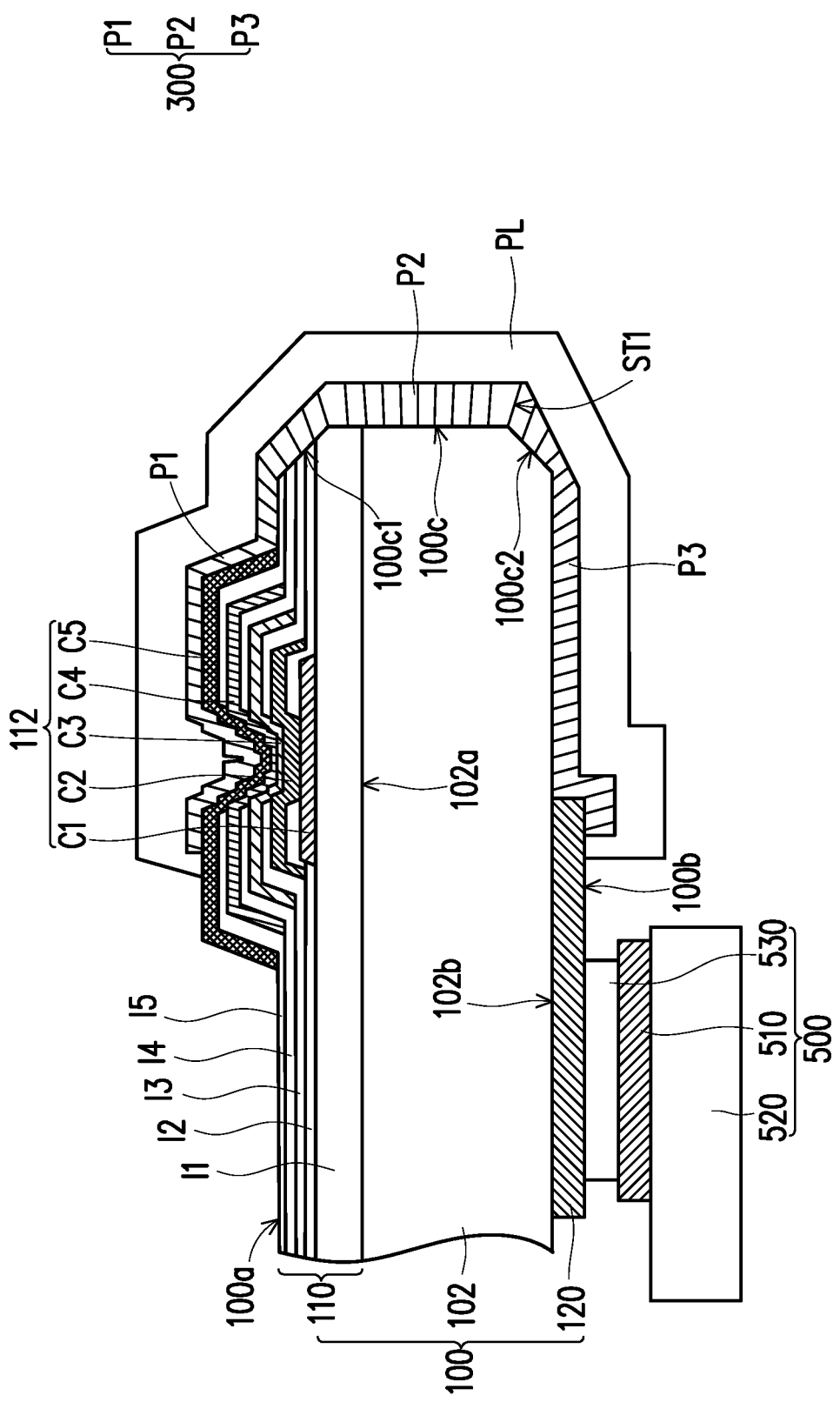
FIG. 9 is a schematic cross-sectional view of a device substrate according to an embodiment of the disclosure.

FIG. 9 is a schematic cross-sectional view of a device substrate according to an embodiment of the disclosure. Note that the reference numbers and some content provided in the embodiment depicted in FIG. 9 are derived from the reference numbers and some content provided in the previous embodiments depicted in FIG. 1A to FIG. 4D, the same reference numbers serve to denote the same or similar devices, and the description of the same technical content is omitted. The omitted description may be referred to as the description provided in the previous embodiments and will not be repeated in the following embodiments.

With reference to FIG. 9, the front circuit structure 110 is located on a front side 102a of the carrier 102. In this embodiment, a side surface of the front circuit structure 110 is aligned to a side surface of the carrier 102, and there is a first inclined surface 100cl between the side surface and a front side of the front circuit structure 110, thereby avoiding damages to edges of the front circuit structure 110, which should however not be construed as a limitation in the disclosure. In other embodiments, there is a round angle or a right angle between the side surface and the front side of the front circuit structure 110.

In some embodiments, the front circuit structure 110 includes a plurality of insulation layers and a plurality of conductive layers. In some embodiments, the front circuit structure 110 further includes a plurality of semiconductor layers. For instance, the front circuit structure 110 includes a first insulation layer I1, a second insulation layer I2, a third insulation layer I3, a fourth insulation layer I4, and a fifth insulation layer I5 that are stacked in sequence. The pad 112 includes a first conductive layer C1, a second conductive layer C2, a third conductive layer C3, a fourth conductive layer C4, and a fifth conductive layer C5 that are stacked in sequence.

In some embodiments, a material of each of the first insulation layer I1, the second insulation layer I2, the third insulation layer I3, the fourth insulation layer I4, and the fifth insulation layer I5 includes silicon oxide, silicon nitride, silicon oxynitride (SiNO), aluminum oxide, organic insulation materials, or other appropriate insulation materials. In some embodiments, a material of each of the first conductive layer C1, the second conductive layer C2, the third conductive layer C3, the fourth conductive layer C4, and the fifth conductive layer C5 includes metal, metal oxide, metal nitride, or other appropriate conductive materials.

The first conductive layer C1 is located on the first insulation layer I1. The second insulation layer I2 is located on the first conductive layer C1 and the first insulation layer I1 and has an opening overlapped with the first conductive layer C1. The second conductive layer C2 is located on the second insulation layer I2 and fills the opening of the second insulation layer I1 to be connected to the first conductive layer C1. The third insulation layer I3 is located on the second conductive layer C2 and the second insulation layer I2 and has an opening overlapped with the second conductive layer C2. The third conductive layer C3 is located on the third insulation layer I3 and fills the opening of the third insulation layer I3 to be connected to the second conductive layer C2. The fourth insulation layer I4 is located on the third conductive layer C3 and the third insulation layer I3 and has an opening overlapped with the third conductive layer C3. The fourth conductive layer C4 is located on the fourth insulation layer I4 and fills the opening of the fourth insulation layer I4 to be connected to the third conductive layer C3. The fifth insulation layer I5 is located on the fourth conductive layer C4 and the fourth insulation layer I4 and has an opening overlapped with the fourth conductive layer C4. The fifth conductive layer C5 is located on the fifth insulation layer I5 and fills the opening of the fifth insulation layer I5 to be connected to the fourth conductive layer C4.

In this embodiment, the front circuit structure 110 includes five insulation layers, and the pad 112 of the front circuit structure 110 includes five conductive layers, which should however not be construed as limitations in the disclosure. The quantity of the insulation layers and the conductive layers in the front circuit structure 110 may be adjusted according to actual requirements. In this embodiment, a surface layer of the pad 112 includes a stepped structure.

In some embodiments, the front circuit structure 110 includes a peripheral region and a display region, where the pad 112 is located in the peripheral region, and the front circuit structure 110 includes a plurality of display devices disposed in the display region (such as inorganic light emitting diodes, organic light emitting diodes, liquid crystal pixels, or other appropriate display devices). The pad 112 is electrically connected to the aforementioned display device through a signal line and other electronic devices.

The back circuit structure 120 is located on a back side 102b of the carrier 102. In this embodiment, the back circuit structure 120 is a single-layer structure, which should however not be construed as a limitation in the disclosure. In other embodiments, the back circuit structure 120 is a multi-layer structure.

The side wiring structure 300 electrically connects the pad 112 to the back circuit structure 120. In this embodiment, the side wiring structure 300 includes the first portion P1 located above the front side 100a of the circuit substrate 100, the second portion P2 located above the side surface 100c of the circuit substrate 100, and the third portion P3 located above the back side 100b of the circuit substrate 100. The side wiring structure 300 includes the streaks ST1 that extend in different directions.

In this embodiment, the first portion P1 of the side wiring structure 300 is in contact with a surface of the fifth insulation layer I5 and is in contact with the pad 112 having the stepped structure. Since the thickness of the first portion P1 is relatively small, the first portion P1 may be better protected from being peeled off due to the excessively large thickness of the first portion P1. In some embodiments, the material of the side wiring structure 300 is copper, and the material of the fifth insulation layer I5 is silicon nitride, thus reducing the thickness of the first portion P1 and better solving an issue of a stress generated due to poor adhesion between the copper and the silicon nitride.

In this embodiment, the back circuit structure 120 is formed first, and then the side wiring structure 300 is formed. Therefore, the third portion P3 of the side wiring structure 300 partially covers the back circuit structure 120. In other embodiments, the side wiring structure 300 is formed first, and then the back circuit structure 120 is formed, whereby the back circuit structure 120 partially covers the third portion P3 of the side wiring structure 300.

The protection layer PL is formed on the side wiring structure 300.

A COF package 500 is bonded to the back circuit structure 120. In this embodiment, the COF package 500 includes a flexible substrate 520 and a pin 510 located on the flexible substrate 520. The pin 510 is electrically connected to the back circuit structure 120 through a conductive connection structure 530. The conductive connection structure 530 is, for instance, a conductive glue, a solder material, or any other appropriate material. In other embodiments, the back circuit structure 120 may be omitted, and the COF package 500 is directly bonded to the third portion P3 of the side wiring structure 300.

Figure 10:
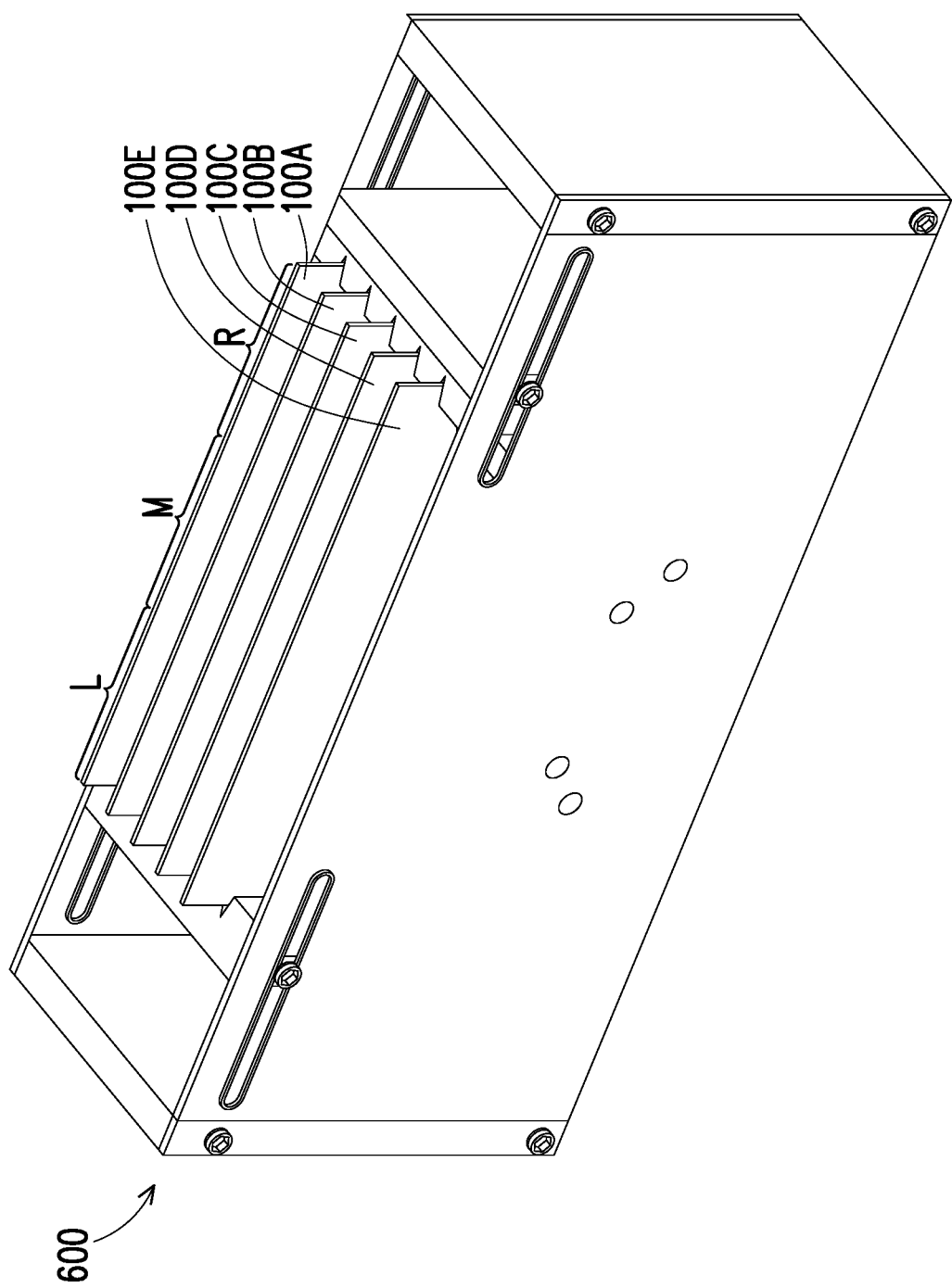
FIG. 10 is a schematic three-dimensional view of a carrier box of a circuit substrate according to an embodiment of the disclosure.

FIG. 10 is a schematic three-dimensional view of a carrier box 600 of a circuit substrate according to an embodiment of the disclosure. In this embodiment, a plurality of circuit substrates 100A to 100E are placed in the carrier box 600, so that the glancing angle deposition process may be simultaneously performed on the circuit substrates 100A to 100E. The structures of the circuit substrates 100A to 100E may be referred to as the circuit substrate 100 provided in any of the previous embodiments. In this embodiment, the circuit substrates 100A to 100E are installed in one carrier box 600, which should however not be construed as a limitation in the disclosure. In other embodiments, the number of the circuit substrates in the carrier box 600 may be adjusted according to actual requirements.

The circuit substrates 100A to 100E are installed in the carrier box 600, the deposition processes depicted in FIG. 1A to FIG. 2D are performed, and then the deposition processes depicted FIG. 5A to FIG. 6D are performed. A thickness of the conductive material layers deposited onto the circuit substrates 100A to 100E (the sum of the thickness of the first conductive material layer 310' and the thickness of the second conductive material layer 320' as shown in FIG. 6D) is measured, and a thickness of the conductive material layers on left regions L of the circuit substrates 100A to 100E, a thickness of the conductive material layers on middle regions M of the circuit substrates 100A to 100E, and a thickness of the conductive material layers on right regions R of the circuit substrates 100A to 100E are measured. The average thickness of the conductive material layers on the front sides 100a of the circuit substrates 100A to 100E is represented as F, the average thickness of the conductive material layers on the side surface 100c of the circuit substrates 100A to 100E is represented as S. and the average thickness of the conductive material layers on the back side 100b of the circuit substrates 100A to 100E is represented as B.

When the included angles between the front sides of the targets applied in the four deposition processes and the side surfaces of the circuit substrates 100A to 100E are all 0° (that is, the front sides of the targets are parallel to the side surfaces of the circuit substrates 100A to 100E), the thicknesses of the conductive material layers in the left regions L, the middle regions M, and the right regions R are shown in Table 2. In Table 2, the unit of thickness is µm.

TABLE 2

| Region | Circuit substrate | | | | | | | | | | | | | | |
|---|---|---|---|---|---|---|---|---|---|---|---|---|---|---|---|
| | 100A | | | 100B | | | 100C | | | 100D | | | 100E | | |
| | F | S | B | F | S | B | F | S | B | F | S | B | F | S | B |
| L | 0.41 | 1.32 | 0.463 | 0.42 | 1.256 | 0.37 | 0.41 | 1.206 | 0.363 | 0.46 | 1.323 | 0.343 | 0.49 | 1.28 | 0.41 |
| M | 0.413 | 1.276 | 0.423 | 0.393 | 1.286 | 0.34 | 0.416 | 1.203 | 0.393 | 0.436 | 1.313 | 0.393 | 0.446 | 1.136 | 0.33 |
| R | 0.423 | 1.4 | 0.44 | 0.41 | 1.353 | 0.426 | 0.42 | 1.31 | 0.393 | 0.47 | 1.323 | 0.42 | 0.466 | 1.216 | 0.383 |

A ratio F/S of the average thickness F to the average thickness S and a ratio B/S of the average thickness B to the average thickness S in Table 2 are calculated, and the calculated results are shown in Table 3. The data in Table 3 are mapped to obtain FIG. 11.

TABLE 3

| Region | Circuit substrate | | | | | | | | | |
|---|---|---|---|---|---|---|---|---|---|---|
| | 100A | | 100B | | 100C | | 100D | | 100E | |
| | F/SS | B/S | F/S | B/S | F/S | B/S | F/S | B/S | F/S | B/S |
| L | 0.310 | 0.351 | 0.334 | 0.294 | 0.339 | 0.301 | 0.347 | 0.259 | 0.382 | 0.320 |
| M | 0.323 | 0.331 | 0.305 | 0.26 | 0.346 | 0.326 | 0.332 | 0.299 | 0.392 | 0.290 |
| R | 0.302 | 0.314 | 0.302 | 0.315 | 0.320 | 0.3 | 0.355 | 0.317 | 0.383 | 0.315 |

When the included angles between the front sides of the targets applied in the four deposition processes and the side surfaces of the circuit substrates 100A to 100E are all 10° (that is, the first included angle θ1 to the fourth included angle θ4 are all 10°), the thicknesses of the conductive material layers in the left regions L, the middle regions M, and the right regions R are shown in Table 4. In Table 4, the unit of thickness is µm.

TABLE 4

| Region | Circuit substrate | | | | | | | | | | | | | | |
|---|---|---|---|---|---|---|---|---|---|---|---|---|---|---|---|
| | 100A | | | 100B | | | 100C | | | 100D | | | 100E | | |
| | F | S | B | F | S | B | F | S | B | F | S | B | F | S | B |
| L | 0.377 | 1.2333 | 0.4066 | 0.399 | 1.144 | 0.3966 | 0.4166 | 1.288 | 0.4233 | 0.4433 | 1.2266 | 0.3433 | 0.4533 | 1.3233 | 0.3733 |
| M | 0.3933 | 1.255 | 0.4633 | 0.4033 | 1.0533 | 0.4833 | 0.4266 | 1.1166 | 0.4666 | 0.466 | 1.2766 | 0.4233 | 0.466 | 1.2966 | 0.377 |
| R | 0.3333 | 1.111 | 0.44 | 0.3466 | 1.0833 | 0.44 | 0.355 | 0.8366 | 0.3366 | 0.4066 | 1.077 | 0.3433 | 0.4133 | 1.177 | 0.3133 |

A ratio F/S of the average thickness F to the average thickness S and a ratio B/S of the average thickness B to the average thickness S in Table 4 are calculated, and the calculated results are shown in Table 5. The data in Table 5 are mapped to obtain FIG. 12.

TABLE 5

| | Circuit substrate | | | | | | | | | |
|---|---|---|---|---|---|---|---|---|---|---|
| | 100A | | 100B | | 100C | | 100D | | 100E | |
| Region | F/S | B/S | F/S | B/S | F/S | B/S | F/S | B/S | F/S | B/S |
| L | 0.3 | 0.329 | 0.342 | 0.347 | 0.325 | 0.33 | 0.361 | 0.279 | 0.342 | 0.282 |
| M | 0.314 | 0.370 | 0.382 | 0.458 | 0.382 | 0.417 | 0.360 | 0.331 | 0.354 | 0.285 |
| R | 0.3 | 0.360 | 0.32 | 0.369 | 0.418 | 0.402 | 0.380 | 0.320 | 0.353 | 0.267 |

Figure 11:
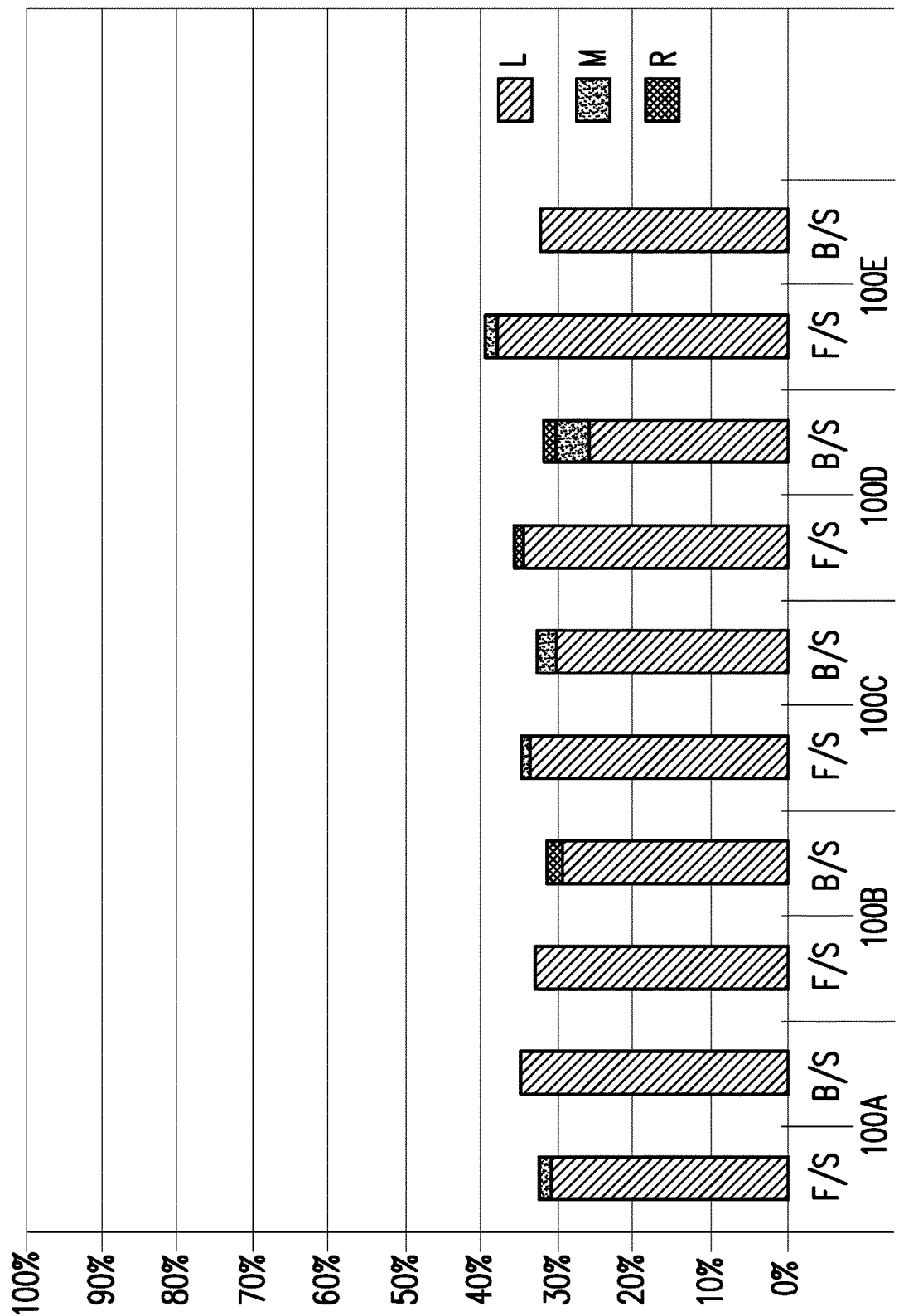
FIG. 11 is a diagram illustrating data of a ratio of thicknesses of some conductive material layers at different locations as provided in the disclosure.
Figure 12:
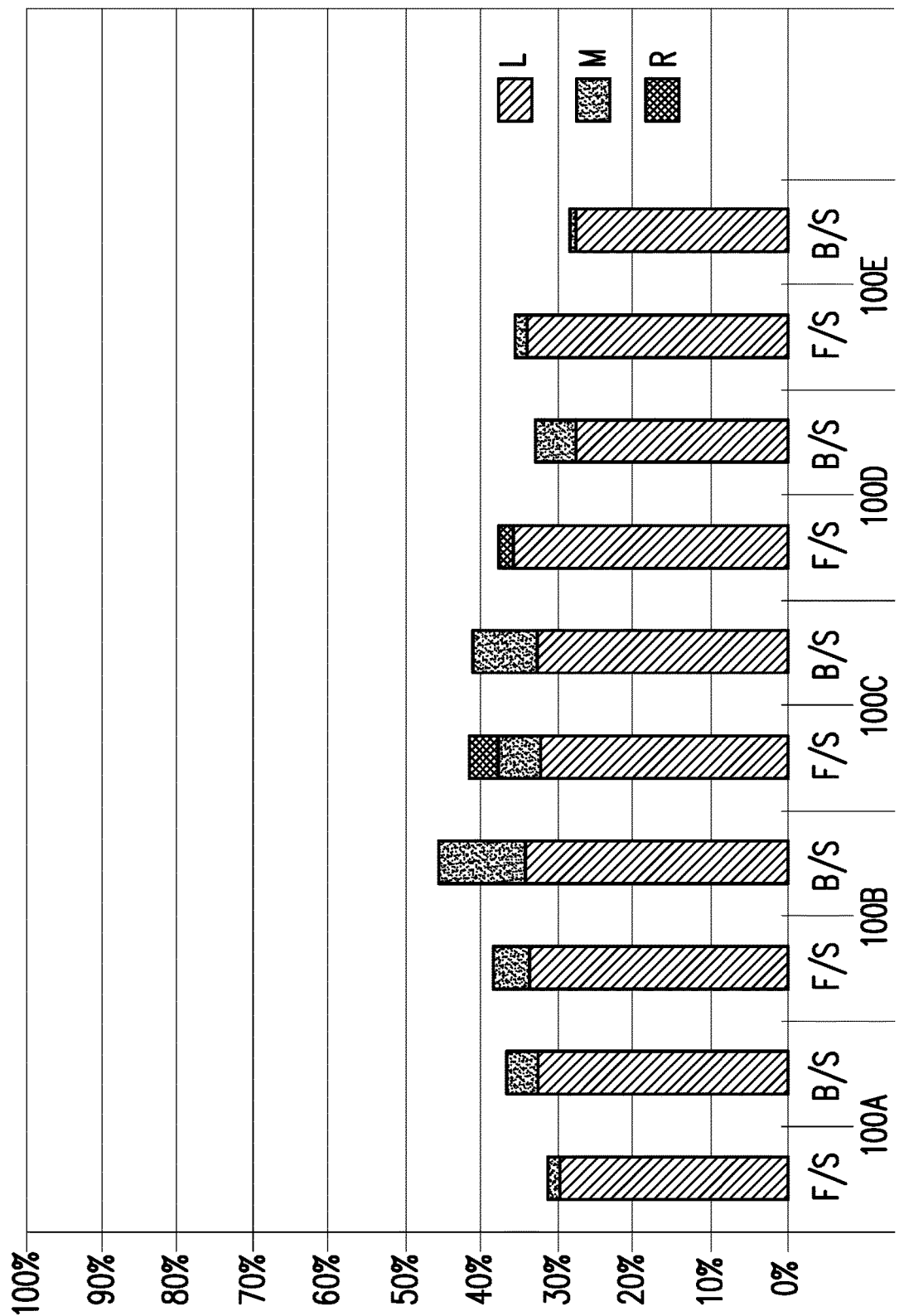
FIG. 12 is a diagram illustrating data of a ratio of thicknesses of some conductive material layers at different locations as provided in the disclosure.

According to comparisons between FIG. 11 and FIG. 12, it can be learned that when the included angles between the front sides of the targets and the side surfaces of the circuit substrates 100A to 100E are 10°, relatively large ratios F/S and B/S may be obtained, where the ratio B/S of the circuit substrate 100B and the ratios F/S and B/S of the circuit substrate 100C may even be greater than 0.4. Therefore, during the glancing angle deposition processes, if the included angle between the front side of the target and the side surface of the circuit substrate is more than 10°, the ratios F/S and B/S are likely to increase.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a device substrate, comprising:
   providing a circuit substrate, the circuit substrate comprising a carrier and a front circuit structure located on a front side of the carrier; and
   forming a side wiring structure electrically connected to the front circuit structure, wherein the side wiring structure extends from the front circuit structure to a back side of the circuit substrate, and a method of forming the side wiring structure comprises:
   performing a first glancing angle deposition process above a front side and a side surface of the circuit substrate by applying a first target, wherein a first angle exists between a front side of the first target and the side surface of the circuit substrate during the first glancing angle deposition process; and
   performing a second glancing angle deposition process above the back side and the side surface of the circuit substrate by applying a second target, wherein a second angle exists between a front side of the second target and the side surface of the circuit substrate during the second glancing angle deposition process, wherein a first conductive material layer is formed by performing the first glancing angle deposition process and the second glancing angle deposition process;
   forming a mask layer on the first conductive material layer; and
   performing an etching process by applying the mask layer as a mask to pattern the first conductive material layer; wherein:
   a cross-sectional structure of the side wiring structure comprises a first portion located above the front side of the circuit substrate, a second portion located above the side surface of the circuit substrate, and a third portion located above the back side of the circuit substrate, wherein each of the first portion, the second portion, and the third portion comprises a plurality of streaks, a ratio of a maximum thickness of the first portion to a maximum thickness of the second portion is A, a ratio of a maximum thickness of the third portion to the maximum thickness of the second portion is B, and each of the ratio A and the ratio B is in a range of 0.25-0.6.

2. The manufacturing method according to claim 1, wherein the circuit substrate further comprises a back circuit structure located on a back side of the carrier, and the side wiring structure extends from the front circuit structure to the back circuit structure.

3. The manufacturing method according to claim 1, wherein the streaks of the first portion, the second portion, and the third portion of the side wiring structure at least extend in three different directions.

4. The manufacturing method according to claim 1, wherein a method of forming the mask layer comprises a photography process, a screen printing process, or an inkjet printing process.

5. A manufacturing method of a device substrate, comprising:
   providing a circuit substrate, the circuit substrate comprising a carrier and a front circuit structure located on a front side of the carrier; and
   forming a side wiring structure electrically connected to the front circuit structure, wherein the side wiring structure extends from the front circuit structure to a back side of the circuit substrate, and a method of forming the side wiring structure comprises:
   performing a first glancing angle deposition process above a front side and a side surface of the circuit substrate by applying a first target, wherein a first angle exists between a front side of the first target and the side surface of the circuit substrate during the first glancing angle deposition process;
   performing a second glancing angle deposition process above the back side and the side surface of the circuit substrate by applying a second target, wherein a second angle exists between a front side of the second target and the side surface of the circuit substrate during the second glancing angle deposition process, wherein a first conductive material layer is formed by performing the first glancing angle deposition process and the second glancing angle deposition process;
   performing a third glancing angle deposition process above the front side and the side surface of the circuit substrate by applying a third target, wherein a third angle exists between a front side of the third target and the side surface of the circuit substrate during the third glancing angle deposition process;

performing a fourth glancing angle deposition process above the back side and the side surface of the circuit substrate by applying a fourth target, wherein a fourth angle exists between a front side of the fourth target and the side surface of the circuit substrate during the fourth glancing angle deposition process, and a second conductive material layer is formed on the first conductive material layer by performing the third glancing angle deposition process and the fourth glancing angle deposition process;

forming a mask layer on the second conductive material layer; and performing an etching process by applying the mask layer as a mask to pattern the first conductive material layer and the second conductive material layer, wherein:

a cross-sectional structure of the side wiring structure comprises a first portion located above the front side of the circuit substrate, a second portion located above the side surface of the circuit substrate, and a third portion located above the back side of the circuit substrate, wherein each of the first portion, the second portion, and the third portion comprises a plurality of streaks, a ratio of a maximum thickness of the first portion to a maximum thickness of the second portion is A, a ratio of a maximum thickness of the third portion to the maximum thickness of the second portion is B, and the ratio of each of A and B is in a range of 0.25-0.6.

6. The manufacturing method according to claim 5, wherein the first conductive material layer is patterned to form a buffer layer, the second conductive material layer is patterned to form a conductive layer, the side wiring structure comprises the buffer layer and the conductive layer stacked together, and the buffer layer and the conductive layer comprise different materials.

* * * * *